United States Patent
Okada et al.

Patent Number: 5,798,312
Date of Patent: Aug. 25, 1998

[54] ELONGATE SUPERCONDUCTOR ELEMENTS COMPRISING OXIDE SUPERCONDUCTORS, SUPERCONDUCTING COILS AND METHODS OF MAKING SUCH ELEMENTS

[75] Inventors: Michiya Okada, Eindhoven, Netherlands; Kazuhide Tanaka; Toyotaka Yuasa, both of Hitachi, Japan; Toshimi Matsumoto, Katsuta, Japan; Katsuzo Aihara, Hitachioota, Japan; Shinpei Matsuda, Toukai-mura, Japan

[73] Assignee: Hitachi, Ltd., Tokyo, Japan

[21] Appl. No.: 267,003

[22] Filed: Jun. 21, 1994

Related U.S. Application Data

[63] Continuation of Ser. No. 747,881, Aug. 21, 1991, abandoned.

[30] Foreign Application Priority Data

Aug. 22, 1990 [JP] Japan .................. 2-218921

[51] Int. Cl.⁶ .................. H01B 12/00
[52] U.S. Cl. .................. 505/230; 505/234; 505/236; 505/239; 505/704; 505/705; 174/125.1; 428/702; 428/930; 428/372; 428/375
[58] Field of Search .................. 505/701, 702, 505/703, 704, 239, 234, 230, 236, 705; 428/688, 689, 702, 364, 372, 375, 930; 174/125.1

[56] References Cited

U.S. PATENT DOCUMENTS

| | | |
|---|---|---|
| 5,057,484 | 10/1991 | Shiota et al. .................. 505/1 |
| 5,079,215 | 1/1992 | Kugimiya et al. .................. 505/1 |
| 5,104,849 | 4/1992 | Shiga et al. .................. 505/1 |
| 5,270,296 | 12/1993 | Hed . |
| 5,516,753 | 5/1996 | Ohkura et al. .................. 505/231 |

FOREIGN PATENT DOCUMENTS

| | | |
|---|---|---|
| 0282286 | 9/1988 | European Pat. Off. . |
| 0292436 | 11/1988 | European Pat. Off. . |

(List continued on next page.)

OTHER PUBLICATIONS

Applied Physics Letters, vol. 54, No. 16, Apr. 17, 1989, pp. 1582–1584.

Okada et al., "Neutron Diffraction Study . . .", *Japanese Jouranl of Applied Physics*, vol. 27, No. 9, pp. L1715–L1717, Sep. 1988.

Kumakura et al., "Critical Current Densities . . .", *Low Temperature Engineering*, vol. 25, No. 2, pp. 88–93, Feb. 1990.

Okada et al., "Ag-Sheathed TI-Ba-Ca-Cu-O . . .", *Japanese Journal of Applied Physics*, vol. 27, No. 12, pp. L2345–L2347, Dec. 1988.

Iye et al., "Absence of Current . . .", *Physica C* 159, pp. 433–438, 1989.

Matsumoto et al., "Development of High-$T_c$ . . .", *Hitachi Review*, vol. 39, No. 1, pp. 55–62, 1990.

Gurvitch et al., Mat. Res. Soc. Symp. Proc. vol. 99 (1988) pp. 297–301.

Sahu et al, "Chemistry of High Tc Superconductors" ACS 1988, Chapter 1.

Science, vol. 240, pp. 25–29, Apr. 1, 1988.

*Primary Examiner*—Marie Yamnitzky
*Attorney, Agent, or Firm*—Antonelli, Terry, Stout & Kraus, LLP

[57] ABSTRACT

An elongate superconductor wiring element having, as seen in section, oxide superconductor material regions in each of which the c-axes of the oxide superconductor crystals are aligned with each other and are transverse to the longitudinal axis of the element. To reduce the dependence of critical current density on angular position of the element relative to a magnetic field, there are a plurality of said regions whose alignment directions of the c-axes are different as between different ones of said regions, so that the wiring element comprises a plurality of said regions having respectively different c-axis alignment directions.

10 Claims, 9 Drawing Sheets

FOREIGN PATENT DOCUMENTS

| | | | |
|---|---|---|---|
| 0357779 | 3/1990 | European Pat. Off. ............... 505/1 |
| 380115 | 8/1990 | European Pat. Off. . |
| 0385485 | 9/1990 | European Pat. Off. . |
| 0401461 | 12/1990 | European Pat. Off. . |
| 0402714 | 12/1990 | European Pat. Off. . |
| 63-277554 | 11/1988 | Japan . |
| 63-279513 | 11/1988 | Japan . |
| 1186711 | 7/1989 | Japan . |
| 1220308 | 9/1989 | Japan . |
| 1-246801 | 10/1989 | Japan . |
| 1-251515 | 10/1989 | Japan . |
| 2250219 | 10/1990 | Japan . |
| 2273418 | 11/1990 | Japan . |
| 3017910 | 1/1991 | Japan . |
| 3095806 | 4/1991 | Japan . |

ANGLE SUBTENDED BY ELEMENT AND MAGNETIC FLUX

ELONGATE SUPERCONDUCTOR ELEMENTS COMPRISING OXIDE SUPERCONDUCTORS, SUPERCONDUCTING COILS AND METHODS OF MAKING SUCH ELEMENTS

This application is a Continuation of application Ser. No. 07/747,881, filed Aug. 21, 1991 (now abandoned).

BACKGROUND OF THE INVENTION

1. Field of the Invention

This invention relates to elongate superconductor elements comprising oxide superconductor materials, to superconducting coils comprising such elements and to methods of making such elements. Oxide superconductor material herein means material which is superconductive in bulk, i.e. in which the crystal grains are joined, e.g. by sintering or other processes, to permit passage of superconducting current.

2. Description of the Prior Art

Since the discovery of oxide superconductors, efforts have continued to be made in many fields to develop technology for their use in industrial applications. Because oxide superconductors have higher critical temperatures and critical magnetic field intensities than conventional metallic alloy superconductors, their application to heavy electric fields, once realized, will unlock an unpredictably wide range of possibilities.

To employ oxide superconductors in the heavy electric field requires transforming them into suitable wire products and forming these products into coils or other forms of conductors. For superconducting oxide products to be used as coils, it is an essential requirement that the conductor is able to pass a sufficient amount of superconducting current in a magnetic field to generate magnetic flux. When forming superconductive oxides into conductive products which have large critical current densities in a magnetic field, it has been considered effective to orient the c-axes of the crystals of the superconductor material in certain directions. There is therefore a need for superconducting oxide wire products with oriented crystals which are suited for drawing and coiling operations and also to provide a method of manufacturing such oxide superconductor products.

It has been found that wire products that are suited for such purposes can be produced by using yttrium oxide based superconductor materials and forming metal-clad superconductors into wires of flat cross-section, as mentioned in the Japanese Journal of Applied Physics 27 (1988), pages 1715–1717, and in JP-A-1-251515.

After the discovery of bismuth and thallium oxide materials, attempts were made to make wires using these oxide materials. One example of fabrication of bismuth (Bi) oxide wire is described in Low-Temperature Engineering, 25 (1990), No. 2, pages 88–93, and another example of a thallium (Tl) oxide wire is discussed in the Japanese Journal of Applied Physics, 27 (1988), pages 2345–2347.

The superconductivity of an oxide superconductor in a magnetic field, as pointed out in Physica C, 159 (1989), pages 433–438, is known to be closely related to the crystal orientation relative to the direction of magnetic field. If the crystal c-axes are oriented perpendicularly to an external magnetic field, there is little performance deterioration even when the superconductors are subjected to relatively high magnetic field. On the other hand, when the crystal c-axes are parallel to the external magnetic field, the superconductivity is lost to a large extent even in a small external field. JP-A-1-246801 (corresponding to EP-A-292436) discusses this problem and proposes orienting wire products differently at different parts of a superconducting coil.

The expert in this field will know the definition of the c-axis and a-b plane of oxide superconductor crystals, but reference may be made to Hitachi Review, 39 (1990), No. 1, pages 55–62 "Development of high-Tc superconducting wire with high critical current density".

In the above-mentioned prior art, with the exception of JP-A-1-246801 mentioned above, there is a problem that consideration is not given to the relationship between the direction of magnetic lines of force and the direction of the conductor. In other words, when subjected to a magnetic field parallel to, rather than perpendicular to, the crystal c-axes or to a magnetic field extending in a direction that is detrimental to the superconductivity, the wires with the oriented c-axes sharply deteriorate in performance as current conductors. Consider an example, in which the previously proposed wire product is wound into a solenoid coil and a current is applied to generate a magnetic field. In this case, if the wire is coiled so that the c-axes are perpendicular to the coil axis, the wire close to the coil centre will exhibit the best performance for that particular magnetic field direction. At the end of the coil, however, since the magnetic lines of force curve in, the angles between the magnetic lines of force and the c-axes are not necessarily optimized and the coil may, depending on the location, be used with magnetic lines of force running parallel with the c-axes. Such a magnetic flux distribution changes according to the magnetic field intensity generated by the coil, so that this problem cannot be solved by simply changing the coiling angle at the end of the coil. The maximum current that can be passed through the entire coil is limited by the portion of the wire where the critical current is the lowest. That is, if there is even a single part of the wire where the magnetic flux is parallel to the c-axes or passes through the wire in a direction detrimental to the superconductivity, the magnetic field generated by the entire coil is limited.

SUMMARY OF THE INVENTION

The object of this invention is to provide an oxide superconductor element whose critical current density will not greatly fall when subjected to a magnetic field in any particular direction and which is suitable for making a coil, and to provide methods of making such elements.

According to the present invention in one aspect there is provided an elongate superconductor element having, as seen in section perpendicular to its longitudinal axis, a plurality of oxide superconductor material regions in each of which the c-axes of most of the oxide superconductor crystals are transverse to the longitudinal axis of the element and the c-axes of the oxide superconductor crystals are generally aligned with each other. The alignment directions of the c-axes are different as between different ones of the regions so that the element has a plurality of such regions having respectively different c-axis alignment directions.

The statement in this description and claims that "the c-axes of most of the oxide superconductor crystals are transverse to the longitudinal axis of the element" means that more than 50% of the crystals have their c-axes oriented in the range 60° to 90° to the longitudinal axis. Preferably at least 80% of crystals have their c-axes in the range 60° to 90° to the longitudinal axis and more preferably 80% of crystals have their c-axes in the range 80° to 90° to the longitudinal axis. Likewise, the statement herein that the c-axes of the crystals in a region are "generally aligned with each other" means that more than 50% of the crystal c-axes in the region (preferably at least 80%) are oriented within 30° of the average c-axis direction of the region. Preferably at least 80% of the crystal c-axes are within 10° of the average c-axis direction of the region. Such requirements, including the most preferred requirements, are easily met by the embodiments of this invention described below.

The regions of different c-axis alignment directions may be respective different portions of a single body of oxide superconductor material, or of a plurality of such bodies. Such a body may be, as seen in section perpendicular to the longitudinal axis of the element, of annular, polygonal ring or coiled strip (e.g. spiral) shape.

Alternatively, the plurality of regions of different c-axis alignment directions are formed by respective discrete bodies of oxide superconductor material.

In order to achieve especially good performance in magnetic fields of any direction, preferably in the element of the invention preferably the different c-axis alignment directions of the regions are such that any notional direction perpendicular to the longitudinal direction of the element is at an angle of not more than 30° to at least one of the c-axis alignment directions.

Furthermore, preferably the c-axis alignment direction of at least one region is at an angle of at least 45°, e.g. 90°, to the c-axis alignment direction of at least one other such region.

The superconductor element generally has a longitudinally extending support for the oxide superconductor material, as is conventional. Preferably the support is an electrically conductive metal, e.g. a matrix thereof with the metal in direct contact with said oxide superconductor material.

In another aspect, the invention provides an elongate superconductor element having a longitudinal axis and a plurality of longitudinally extending oxide superconductor material bodies embedded side-by-side in a matrix. The c-axes of the oxide superconductor crystals of each body are generally aligned with each other in the plane radial to said longitudinal axis and most of the c-axes are transverse to the longitudinal axis of the element. The respective directions of c-axis alignment of the bodies are distributed in the radial plane, i.e. occupy one plurality of different directions in the radial plane.

In yet another aspect, the invention provides an elongate superconductor element having oxide superconductor material arranged around a central longitudinal axis of said element, the c-axes of the oxide superconductor crystals being directed generally radially relative to said axis.

In a further aspect, the invention provides an elongate superconductor element having a plurality of longitudinally extending oxide superconductor material bodies arranged around a central longitudinal axis of the element, wherein the c-axes of the oxide superconductor crystals of each body are generally directed parallel to the radial line joining the axis to the centre of each body as seen in the radial plane.

The invention further consists in superconducting coils comprising coiled elongate elements of the invention.

In its method aspect, the invention provides a method of making an elongate superconductor element comprising the steps of (a) providing a plurality of elongate oxide superconductor bodies each having the c-axes of most of the oxide superconductor crystals transverse to the longitudinal direction of the body with said c-axes being generally aligned with each other, and (b) assembling said bodies side-by-side in such a way that the respective c-axis alignment directions of at least some of the bodies are different from each other.

In another method aspect, there is provided a method of making an elongate superconductor element, comprising forming a layer of oxide superconductor material on a surface of a support having an axis and orienting the c-axes of the oxide superconductor crystals of the layer so that they are directed generally radially relative to said axis. This method may include the step of longitudinally drawing the support, e.g. prior to a heat treatment which effects the orienting of the c-axes.

Another method of making an elongate superconductor element according to the invention comprises the steps of forming a layer of oxide superconductor material on a surface of an elongate plate-shaped support and orienting the c-axes of the oxide superconductor crystals of said layer so that they are directed generally perpendicularly to said surface. The plate-shaped support is coiled about an axis extending longitudinally thereof, and such coiling may take place prior to a heat treatment which effects the orienting of the c-axes.

It is preferred as mentioned that the oxide superconductor bodies be clad with a metal, preferably a highly conductive metal such as copper. It is also possible to clad them with ceramic materials such as MgO and $SrTiO_3$.

When applied to a solenoid coil, the superconductor element should preferably to formed into a circular or regular polygonal shape in transverse cross-section. In this case, the superconductor body or bodies are preferably arranged about the centre of the transverse cross-section of the element and the angle between the c-axis crystal alignment of each body and a diametric line connecting the axis of the element to the body is set to a specified angle. One superconductor body may be provided at the centre of the transverse cross-section of the element. When applied to a pancake coil, the element should desirably be flat in cross-section.

In a solenoid or cylindrical coil, the element may be so arranged that the crystal c-axis alignment of each superconductor body is directed at a specified angle with respect to the cylinder core axis. It is desired that the oxide bodies be clad with metal because the metal cladding material helps to stabilize the superconductor bodies. In that case, the use of silver, silver alloy, gold or gold alloy is recommended for the portions where the metal cladding contacts the superconductor.

This invention thus provides an oxide superconductor element whose current carrying capacity shows little degradation in magnetic fields.

Although the invention is not limited in the range of applicable superconductors, it is effectively useful for all oxide superconductors with anisotropic superconductivity.

The following are examples of oxide superconductor materials which can be used in the invention.

where x1 and y1 are 0–0.5, a1, b1 and c1 are 1.8–2.2, d1 is 1.7–3.3, e1 is 8–10 and a1+b1+c1+d1 is 9 or less.

where x2 is 0–0.5, a2, b2 and c2 are 1.8–2.2, d2 is 1.7–3.3, e2 is 8–10 and a2+b2+c2+d2 is 9 or less.

where Y is one or more elements chosen from yttrium and the lanthanide series, a3 is 0.9–1.1, b3 is 1.8–2.2, c3 is 2.7–4.4, a3+b3+c3 is 7 or less, δ is 0–0.5, and d3 is 8 or less.

In more detail, various kinds of known oxide superconductive materials may be used. For example:

$Tl_a$—$Ba_b$—$Ca_c$—$Cu_d$—$O_e$, where (1) a:b:c:d:e=1.8–2.2:1.8–2.2:1.8–2.2:2.7–3.3:9–10, (2) a:b:c:d:e=1.8–2.2:1.8–2.2:0.8–1.1:1.8–2.2:7.2–8.8, or (3) a:b:c:d:e=1.8–2.2:1.8–2.2:0:0.9–1.1:5.4–6.6.

$Tl_a$—$(Ba_{1-x}, Sr_x)_b$—$Ca_c$—$Cu_d$—$O_e$, where x=0–0.5 and (1) a:b:c:d:e=1.8–2.2:1.8–2.2:1.8–2.2:2.7–3.3:9–11, (2) a:b:c:d:e =1.8–2.2:1.8–2.2:0.9–1.1:1.8–2.2:7–9, or (3) a:b:c:d:e=1.8–2.2:1.8–2.2:0:0.9–1.1:5–7.

$(Tl_{1-x}, Pb_x)_a$—$Ba_b$—$Ca_c$—$Cu_d$—$O_e$, where x=0–0.5 and (1) a:b:c:d:e=1.8–2.2:1.8–2.2:1.8–2.2:2.7–3.3:8–12, (2) a:b:c:d:e=1.8–2.2:1.8–2.2:0.9–1.1:1.8–2.2:7–9, or (3) a:b:c:d:e=1.8–2.2:1.8–2.2:0.91–1.1:5–7.

$Y_a$—$Ba_b$—$Cu_c$—$O_d$, where Y is an element chosen from yttrium and the lanthanide series and (1) a:b:c:d=0.9–1.1:1.8–2.2:2.8–3.3:6.5–7.3, or (2) a:b:c:d=0.9–1.1:1.8–2.2:3.8–4.4:7.2–8.8.

$(Bi_{1-x}, Pb_x)_a$—$Sr_b$—$Ca_c$—$Cu_d$—$O_e$, where x=0–0.5 and (1) a:b:c:d:e=1.8–2.2:1.8–2.2:1.8–2.2:2.7–3.3:9–11, (2) a:b:c:d:e=1.8–2.2:1.8–2.:0.9–1.1:1.8–2.2:7–9, or (3) a:b:c:d:e=1.8–2.2:1.8–2.2:0:0.9–1.1:5–7.

In the transverse cross-section of the element, the oxide bodies may be arranged in multiple layers in which superconductor layers and metal layers are alternated from the centre of the cross-section toward the outer surface. In this case, the thickness of each layer is preferably in the range 0.1 μm to 0.1 mm.

One example of a method of making an oxide superconductor element of the invention is as follows. Oxide powder is filled into a metal cladding pipe, which is then drawn by a wire-drawing machine and rolled by a rolling mill to form it into a wire body of a desired transverse cross-section. A plurality of these wire bodies, preferably six or more of them, are assembled together and inserted into a metal cladding pipe and subjected to similar plastic working to form them into a multicore element of a desired transverse cross-sectional structure. In aligning the crystals of each component wire body, it is effective to form them flat in cross-section. The thickness of the flat oxide superconductor wire body is preferably 0.1 μm to 0.2 mm and more preferably 1 μm to 100 μm.

While the element should desirably be isotropic in cross-section for easy plastic working, it may be flat in cross-section. The coiling of the element requires the use of insulation between the coil layers. This may effectively be accomplished by forming an electrically insulating metallic oxide over the surface of the outermost metal cladding layer of the element. Metals that may be used include those which will form a dense electrically insulating oxide film in the presence of ambient oxygen, such as nickel, nickel alloy, stainless steel, titanium, titanium alloy and various other heat-resistant, oxidation-resistant alloys.

The layered cross-sectional structure may be formed by the following method according to the invention. First, oxide superconductor is filled into a metal sheath, which is then drawn into a wire body. The drawn wire body is rolled into a tape, which is then wound at right angles with respect to the longitudinal direction of the tape to form a spiral tape. This spiral tape is again inserted into a metal pipe, which is then drawn along the axis of the spiral. During this plastic working, it is preferred that the element be formed into a regular polygon in cross-section as by hexagonal dies.

With this method, it is possible to form the metal layers and the superconductor layers, of say hexagonal cross-section, alternately from the centre of the cross-section toward the outer surface. The preferred thickness of each superconductor layer falls in the range between 0.1 μm and 0.1 mm because this range of thickness contributes to improvement in the crystal alignment or orientation that is achieved during the sintering heat treatment process. When the heat treatment is performed in appropriate conditions, a structure is obtained in which the a-b planes of the crystals are oriented parallel to each side of the polygon. Since such elements of the invention have no particular direction to which the crystal orientation of the whole wire product is restricted, their current carrying capacities are hardly affected by the direction of magnetic field and high critical current can be achieved.

Some further explanation of the operation of the elements of the invention will now be given.

There are conflicting requirements to maintaining a high critical current density Jc in an oxide superconductor element while preventing the current carrying capacity from deteriorating due to magnetic flux in particular directions. That is, as the uniformity of crystal orientation of the wire product is enhanced to increase the critical current density Jc, the sensitivity to the direction of magnetic field increases.

Therefore, when the wire product with high critical current density is used in a coil, the coiling operation should be performed in such a way that the magnetic field direction lies parallel to the c-axes of the crystals at all times. This, however, is not practical because the magnetic field distribution itself will change with the intensity of the field generated. To cope with this problem, the products of this invention have the following features. The product is made up of core member(s) (oxide body or bodies) whose crystals are oriented in the direction of longitudinal axis of the wire member, that is to say the a-b plane of oxide crystals making up each body is oriented in the longitudinal direction. In addition, the crystal c-axis alignment is made to vary from one body or region to another in the transverse cross-sectional plane of the element. In one preferred transverse cross-sectional structure, a plurality of core bodies are located symmetrically about the centre of cross-section of the product and these core bodies are so disposed that the crystal alignment of each body approximately coincides with a line connecting the cross-sectional centres of the body and the whole element respectively.

The number of core bodies contained in the element may vary depending on the kind of superconductor used. For instance, the number of core bodies may be four or more for lanthanum and yttrium oxides; for thallium oxide at least six core bodies are preferably used; and for bismuth oxide preferably more than twelve. In any case, the greater the number of bodies, the less the element is susceptible to performance deterioration due to magnetic field in particular directions. This is because the core bodies have c-axis alignment in various directions in the transverse cross-sectional plane of the element. If the direction of magnetic flux changes, there are always one or more core bodies that have high current densities, preventing the critical current density of the multicore wire as a whole from falling markedly.

The conductor elements of this invention are particularly suited for applications in coils, such as solenoid coils and pancake coils. Performance can further be improved if the angle between the core cylinder axis of the coil and the crystal orientation of each core wire is set to a specific angle. The cylindrical solenoid coil, for example, has the strongest magnetic field intensity at the central portion of the winding in the innermost layer, with the intensity reducing towards the outer layer and ends. At the central portion of the winding, the magnetic field is directed along the longitudinal axis of the coil while at the ends the radial components of the field increase. These changes in the magnetic field direction can be dealt with by winding the multicore element of this invention appropriately.

The element may have a layered structure, in which case the core body is preferably formed into a regular polygon in cross-section with crystals in each side of the polygon arranged so that the a-b crystal planes are aligned parallel to the side of the polygon. The polygon desirably has six or more angles.

By arranging the cross-sectional structure of the element as explained above, the dependence of the critical current density of element on the direction of magnetic field can be reduced or eliminated. This is because the element of this invention maintains a high degree of alignment of a-b crystal planes along the longitudinal direction while at the same time the crystal alignment as a whole is varied in the transverse cross-sectional plane.

The dependence of the current carrying performance of the core body varies according to the material used. For strongly anisotropic materials, which have a great dependence on the magnetic field direction, the distribution of crystal alignment on a transverse cross-sectional plane can be optimized.

INTRODUCTION OF THE DRAWINGS

Embodiments of the invention will now be described by way of non-limitative example, with reference to the accompanying drawings in which.

DESCRIPTION OF THE PREFERRED EMBODIMENTS

Figure 1:
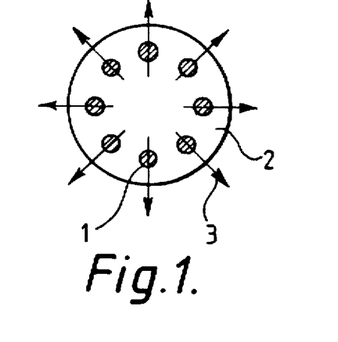
FIGS. 1 to 5 are transverse cross-sectional views of elongate superconductor elements embodying this invention.

FIG. 1 shows a transverse cross-section of an elongate oxide superconductor element embodying this invention. Core bodies or wires 1 made of $Tl_2Ba_2Ca_2Cu_3O_{10}$ oxide superconductor are disposed so that the c-axes of crystals in the core wires 1 are perpendicular to the longitudinal direction of the wire product (in FIG. 1, this longitudinal direction is perpendicular to the plane of the sheet) and also aligned in each wire 1 in the same direction as the diameter of the element at that wire 1 (as indicated by the arrows 3 in FIG. 1). A total of eight core wires 1 are arranged symmetrically about the axis of the element. The wires are embedded in a silver clad 2.

Figure 2:
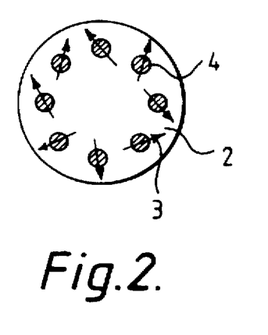

FIG. 2 illustrates an embodiment of the invention using a $Bi_{1.6}Pb_{0.4}Sr_2Ca_2Cu_3O_{10}$ superconductor core wire 4, which differs from the embodiment of FIG. 1 in that the orientation of the c-axis alignment of each core wire 4 in the transverse cross-section is random. The wires 4 are each arranged to extend in the longitudinal direction.

Figure 3:
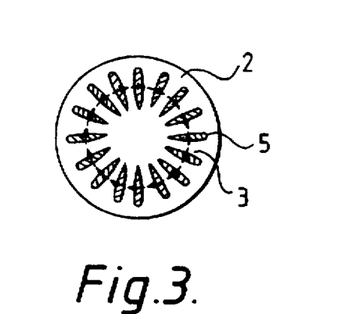

FIG. 3 shows another example, in which core wires 5 in the superconductive oxide element are flat in cross-section. The total number of core wires 5 in the element is sixteen, with the c-axis alignment direction 3 of each core wire 1 disposed perpendicular to the plane of flatness of the core wire. These flatness planes are disposed along radial directions of the element. The flat core wires 5 are 0.1 µm to 0.1 mm thick.

Figure 4:
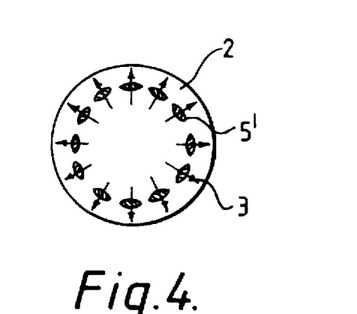

FIG. 4 represents another example, in which the core wires 5' are flat in cross-section as in the case of FIG. 3 but with the c-axis alignment direction 3 of their crystals oriented in radial directions. The total number of wires is twelve.

Next, a process for making the elements of this invention shown in FIGS. 1 and 2 will be described.

A combination of $Tl_2O_3$, BaO and CuO or of $Bi_2O_3$, SrO, CaO, CuO and PbO is used as a starting material and these components are mixed at a specified composition ratio. The thallium oxide was heated and sintered in an alumina crucible with a lid in the presence of air at a temperature of 850° C. for seven hours and the bismuth oxide at 845° C. for 100 hours. This roasted powder was pulverized by automated mortar for 30 minutes and formed into pellets 30 mm across and 3 mm thick.

These pellets were sintered again at 850° C. for seven hours for the thallium oxide and, for the bismuth oxide, at 845° C. for 100 hours to make them superconductive. The critical temperature Tc of the compound was 120K for the thallium oxide and, for the bismuth oxide, 105K. The critical current density Jc was 200 A/cm$^2$ for both compounds. These compounds were pulverized and formed into pellets 50 mm in diameter and 8 mm in thickness.

Then, the pellets were heated and sintered by hot pressing at 700°–780° C. for 1–20 hours under a pressure of 1–20 kg/cm$^2$. After having undergone this single-axis pressure sintering, the pellets had a structure in which 90% of the a-b planes of thallium or bismuth oxide crystals are oriented parallel to the disc surface of each pellet. The pellets were cut parallel to the disc surface to form bar-like specimens each 3 mm across and 40 mm long.

Next, a round silver bar 30 mm in outer diameter and 60 mm in length was prepared. This silver bar was cut with eight holes each 3.3 mm in diameter in the manner shown in FIG. 1, and the superconductive component wires are inserted into the holes. The thallium superconductive component wires were inserted such that in each case the c-axis crystal alignment lies in the same direction as the diameter of the silver bar cross-section at the location of the respective wire. For the bismuth superconductive component wires, no such directional arrangement was made, but the c-axis alignment direction was chosen randomly (FIG. 2).

The ends of the round silver bar were plugged at the holes with fine silver bars 3 mm across. The round silver bar was then drawn into a elongate product 1.5 mm in outer diameter and 2.4 m in length. The cross-section of this product was ground and polished for an X-ray observation of oxide crystal orientation. The investigation showed that the element of FIG. 1 has the crystal c-axes aligned in the same direction as the diameter and that for the product of FIG. 2, the c-axis crystal alignments are random with respect to the diameter directions.

From the X-ray diffraction results, it was found that in each superconductive component core wire more than 90% of the crystals for the thallium oxide and more than 95% for the bismuth oxide are oriented within ±2.50 of the intended direction.

Next, one example of a process of making the element of this invention shown in FIGS. 3 and 4 will be explained. The materials used for fabricating the oxide superconductive wire were $Tl_2O_3$, BaO, SrO, CaO and CuO. These components were mixed at a specific ratio (2:1.6:0.4:2:3) and sintered in an alumina crucible with a lid in the presence of air at 850° C. for seven hours. This roasted powder was pulverized by automated mortar for 30 minutes and formed into pellets each measuring 30 mm across and 3 mm thick. The pellets have a critical temperature of 115K and a critical current density of 700 $A/cm_2$.

The pellets were pulverized, the powder was loaded into a silver tube 6 mm in outer diameter, 4 mm in inner diameter and 400 mm in length. The loaded silver tube was drawn into a wire rod 1.0 mm across and 8 m long. This wire rod was then rolled by a cold rolling mill whose roll diameter is 110 mm, to form a tape 50 µm thick and 3 mm wide. Lengths of this tape were inserted as tapes 5,5' into flat holes cut in a round silver bar 15 mm in outer diameter whose transverse cross-section is as shown in FIG. 3 or FIG. 4. Then, the silver bar loaded with the superconductive tapes was subjected to repetitive wire-drawing operations to form a wire product 8 mm in outer diameter and 2 m in length. This wire product was further heat-treated at 850° C. for 200 hours. As a result, the a-b planes of the oxide crystals were grown parallel to the flat surfaces of the superconductive tapes 5,5'.

The tape-shaped core wires 5,5' had a thickness of 15–20 µm. X-ray diffraction examination found that more than 95% of the crystals are oriented with a-b planes within ±2.5° of the flat surfaces of the core. Therefore, the direction of the a-b plane is radial in the cross-section of FIG. 3 and circumferential in the cross-section of FIG. 4. The core wire thickness can further be reduced to about 2–5 µm by performing additional wire-drawing operations. In this case, the orientation showed a significant improvement, i.e. more than 99% of the crystals in each core 5,5' were oriented in the same direction. The crystal alignment in the same direction resulting from the crystal growth along the surface became more prominent as the core wire thickness decreased. However, since the oxide powder is not easily subjected to plastic working, the superconductor core wire thickness could not easily be reduced below 5–15 µm with this method when oxide powder is present. Further reduction in thickness resulted in a lower core wire thickness, making it impossible to provide a sufficient critical current density Jc.

Figure 5:
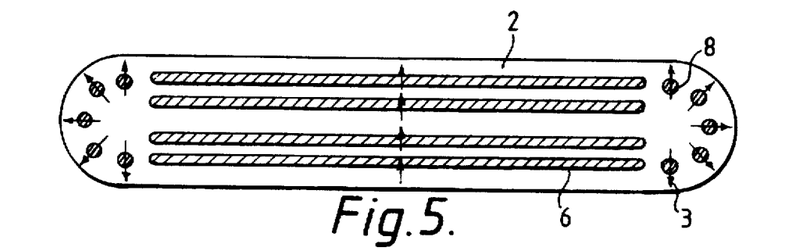

FIG. 5 shows one example of a flat elongate element according to this invention. At the central part of the cross-section the element has flat bismuth oxide bodies 6, and at both side parts of the cross-section, thallium oxide superconductor wire bodies 8 are used. Because their performance is relatively independent of the direction of magnetic flux, the thallium oxide wires 8 were located at the sides for optimum magnetic field distribution, while the bismuth oxide bodies 6 which are sensitive to the direction of magnetic flux were positioned at the centre. Thus, the material of the superconductive element is not necessarily limited to only one kind, but any desired combination of superconductive materials may be chosen according to the magnetic field distribution.

FIGS. 6(a) to 6(e) illustrate a process of making the product of FIG. 5 according to this invention. In this embodiment, a multicore element of FIG. 6(a) similar to that of FIG. 1, but with ten core wires, is divided in two (b); a plurality of flat superconductor tapes with metal cladding, one of which is shown at (c), are stacked together as shown at (d); this stack and the divided elements of (b) are loaded into a prefabricated silver tube 20 as illustrated at (e); and the assembled wire rod is then rolled to produce the desired element of FIG. 5.

Figures 6A, 6B, 6C, 6D, 6E:
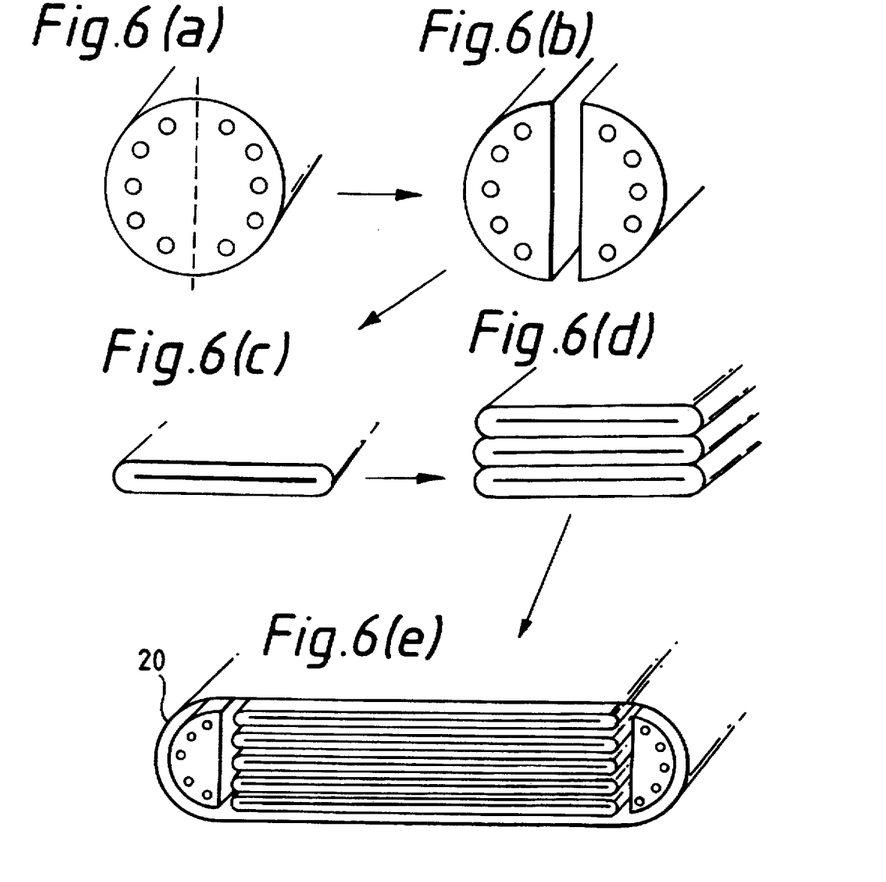
FIGS. 6(a)–6(e) are a series of schematic views showing the process for making the product of FIG. 5.
Figure 7:
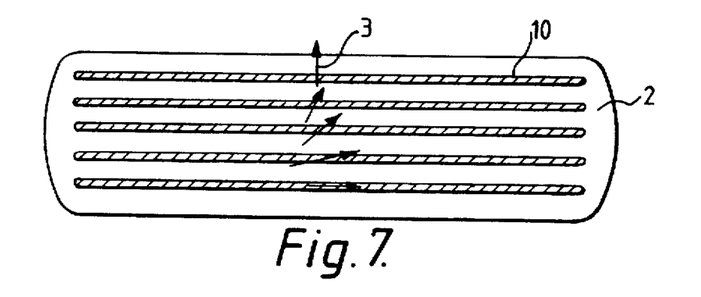
FIGS. 7 to 16 are transverse cross-sectional views of further superconductor elements embodying this invention.

As shown in FIG. 7, it is possible to stack multiple flat superconductive component wires 10 of the shape of FIG. 6(c). In this case, the crystal orientations of each superconductive component wire (c-axis alignment of crystals in each superconductive component wire) are normal to the longitudinal direction of the wire, but the crystal alignments 3 in a plane crossing the longitudinal direction at right angles are shifted slightly from each other, producing a similar overall effect to that obtained when the crystals are randomly oriented, although in this case the range of angular distribution is less. This restricted range of alignment directions of the c-axes is not a problem, when forming a coil, if the element of FIG. 7 is placed back-to-back with another identical element.

Figure 8:
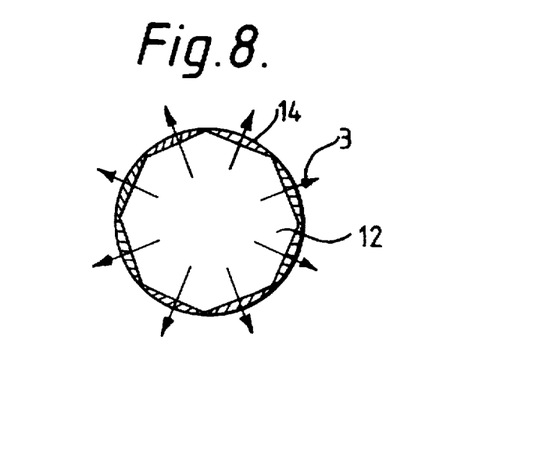

FIG. 8 shows one example of the product according to this invention in which a ceramic body (MgO) of polygonal cross-section is used as a substrate. In this example, a sintered MgO rod 12 with octagonal cross-section has attached to it $Bi_{1.6}Pb_{0.4}Sr_2Ca_2Cu_3O_{10}$ superconductive component bodies 14 on the surface in such a manner that the c-axis alignment direction 6 of the oxide crystals on each face is perpendicular to that face of the substrate.

A process of making the wire product of FIG. 8 using a thallium oxide will be described. A polycrystalline MgO rod (20 mm across and 400 mm long) was worked into a rod 12 of regular polygonal cross-section. Then, on the surface of this rod was formed a thallium oxide superconductive film by sputtering. The film was annealed in air at 830° C. for 30 hours. The critical temperature measured was 125K. X-ray diffraction inspection revealed that the crystal c-axes are oriented in a direction normal to each side of the rod. Examination of directional variations of the c-axes using maximum point mapping showed that the orientation deviation is within 2°. In a magnetic field of 1 tesla (T), this wire product has a critical current value of more than 10 A and a critical current density Jc of $10^4$ to $10^5$ $A/cm^2$. The critical current density Jc exhibited almost no change when the wire product was rotated in the plane of its cross-section.

Figure 9:
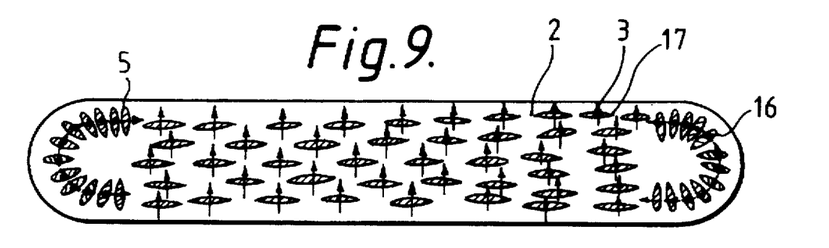
Figure 10:
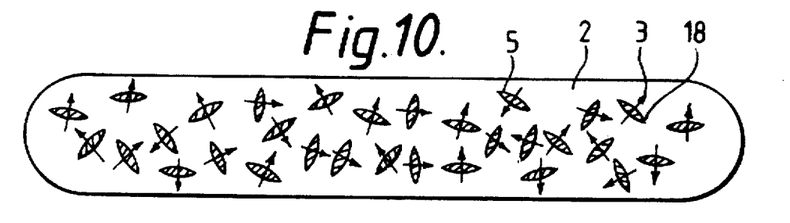

FIGS. 9 and 10 shows other examples of flat wire products, which differ from the product of FIG. 5 in terms of the c-axis directions of alignment. In FIG. 9, twelve flat superconductive component wires 16 are arranged as shown at each side portion of the flattened wire product to reduce the effect of non-uniform magnetic field distribution at the sides of the element. At the central region, flat superconductive wires 17 are arranged parallel to each other. The c-axes of each superconductive core wire 16,17 are normal to the flat surface.

In FIG. 10, the c-axis crystal alignment directions (which are perpendicular to the longitudinal direction of the element) of the flat superconductive core wires 18 are randomly distributed in the cross-section of the flattened wire product. To make this embodiment, a silver bar (100 mm across and 200 mm long) is formed with a plurality of flat holes each measuring 10 mm wide and 3 mm thick by discharge machining. The flat surfaces of the holes are directed randomly. Thallium oxide superconductive powder, which has been prepared beforehand, is filled into the holes in the round silver bar. The bar is then drawn into a wire rod 2.8 mm in outer diameter and 2–5 m in length. After each 25% reduction, the drawn wire is annealed at 400° C. for 30 minutes. The drawn wire is heat-treated at 835° C. for 200 hours. After this long heat treatment, the a-b planes of crystals of superconductor have grown parallel to the flat boundary surface between the superconductor and the silver.

Addition in trace amounts of compounds, such as PbO, $K_2O$ or $K_2CO_3$, which help promote the crystal growth, to the filling powder, accompanied by heat treatment at 650°–850° C. for 5–100 hours, improves the alignment of the crystals. When the ratio of the amounts of elements is 2:2:2:2:x for Tl:Ba:Ca:Cu:(K or Pb), x is preferably 0.05–0.5. The crystal grain size can be more than 10 times greater than when such compounds are not added.

Figure 11:
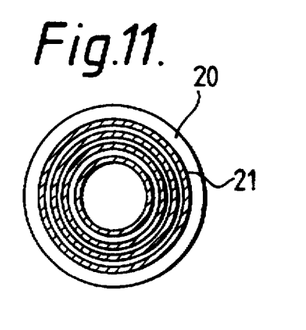

FIG. 11 shows another embodiment of a product according to this invention. The cross-sectional structure of the product is circular and has annular superconductor oxide layers 21 and metal layers 20 alternately. The c-axes of the oxide crystals are all in the radial direction relative to the axis of the element and the a-b planes of the crystals are aligned in the longitudinal direction.

Figure 12:
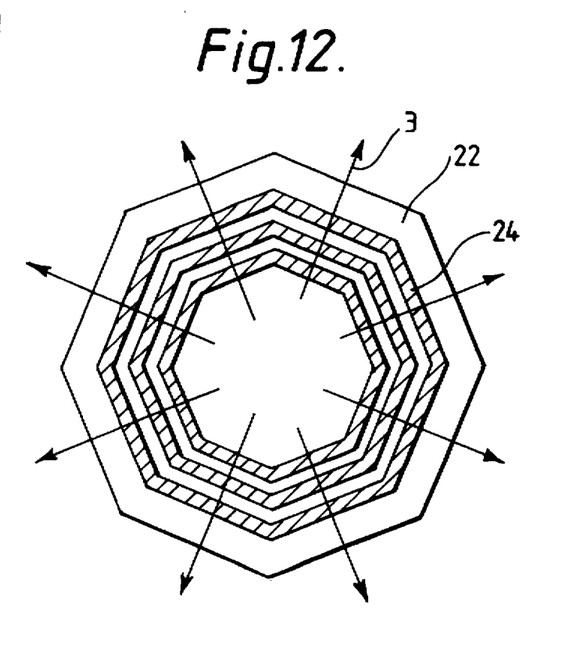

FIG. 12 also shows another symmetrical layered cross-sectional structure of an element of this invention, similar to FIG. 11. The cross-sectional shape of the element and each superconductive layer 24 is a regular polygon to enhance the alignment of the crystals in each side of the polygon. In this example, the element has an octagonal cross-section and the radial thickness of the oxide superconductor layers 24 is 0.1 μm to 0.1 mm because in this range of thickness a sufficient amount of current can easily be passed. This thickness is desirably in the range of 1 to 20 μm. The crystal orientation of each ring-shaped core wire 24 varies around the polygon, with the crystal c-axes in each side extending normal to the side, i.e. approximately radially relative to the centre axis.

Figure 13:
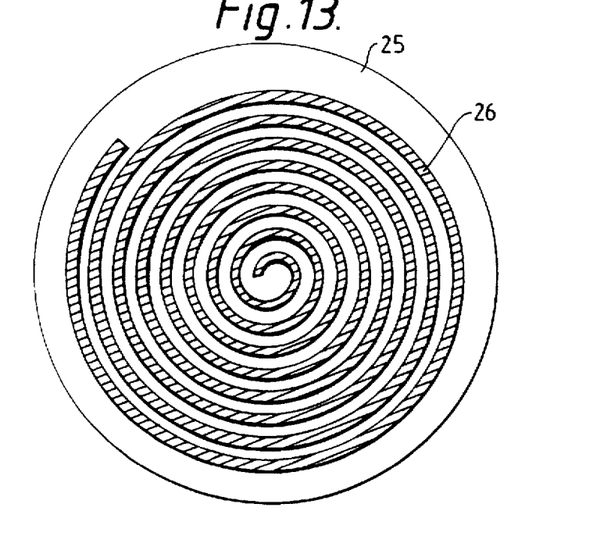

FIG. 13 shows still another layered cross-sectional structure of an element of this invention, similar to FIG. 11. It differs from FIG. 11 in that a single core body 26 is embedded spirally coiled in the metal matrix 25. The c-axes of the oxide superconductor crystals are at all points directed parallel to the radial direction relative to the centre axis of the element and the a-b planes of crystals are oriented in the longitudinal direction.

Figure 14:
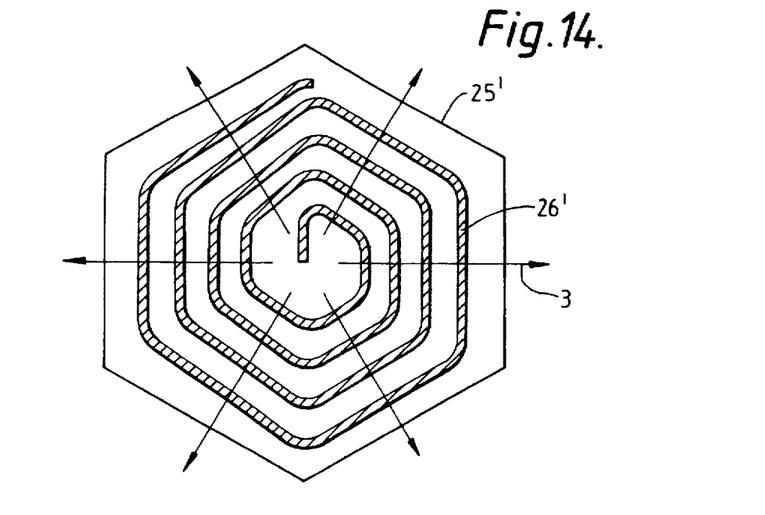

FIG. 14 illustrates a cross-sectional structure of an element similar to that of FIG. 13 but with the outer diameter formed as a hexagon and the spirally coiled core 26' having six flat sides in each turn of the spiral. The crystal c-axes of the wire 26' are almost completely normal to the outer sides of the metal layer 25', as indicated by arrows 3.

Figure 15:
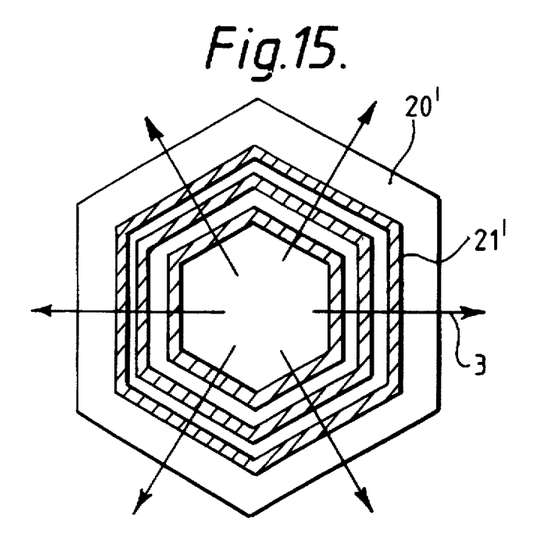

While the superconductive core 26' in FIG. 14 is wound spirally, the element of FIG. 15 has multiple polygonal layers 21' as in FIG. 11 but with a hexagonal cross-section. In this case, the directions normal to the outer sides of the metal layer 20' strictly agree with the directions of crystal c-axes of the respective portions of the core layers 21'.

We have shown some embodiments of wire products and their cross-sectional structures in the foregoing. The regular polygon cross-section referred to in these embodiments means polygons with four or more angles but preferably not more than 20 angles.

Figure 16:
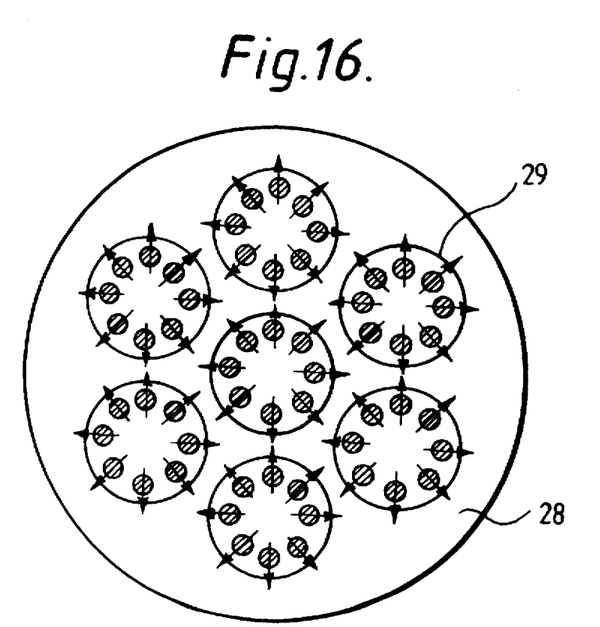

An example of an element of the invention which uses a plurality of the products described above as components is shown in FIG. 16 which shows a multicore element, in which seven component elements 29 each with the cross-sectional structure of FIG. 1 are embedded in a metal matrix 28. It is also possible for example to form products which have seven elements with the cross-section of FIG. 14 or seven elements with the cross-section of FIG. 15.

In these cases, the metal cladding material used is silver and the outermost layer may be coated with a nickel oxide insulating layer. The nickel oxide insulating layer on the outer surface of the product may be formed by first coating the outermost layer of the metal pipe with nickel and oxidizing the nickel layer during the final heat treatment.

Figure 17:
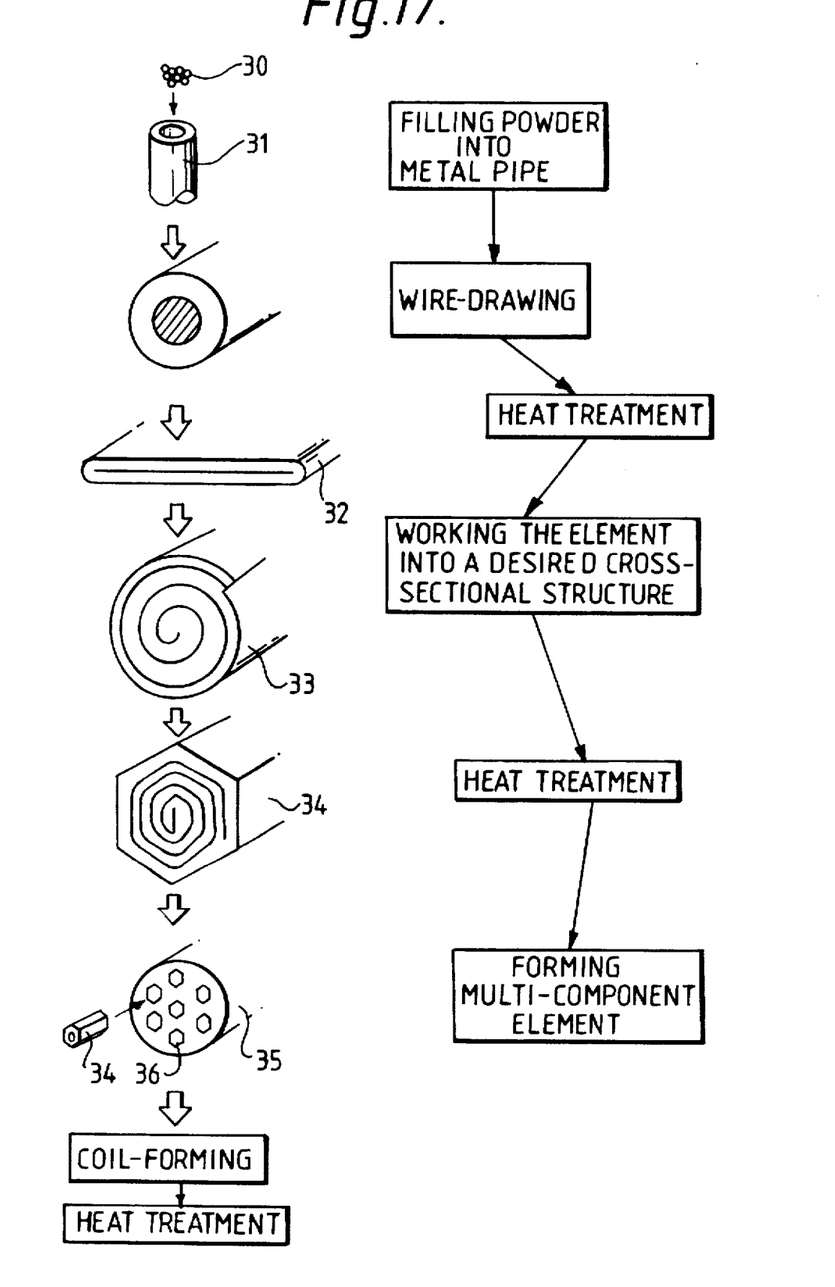
FIGS. 17 and 18 are schematic series of views showing processes of making products according to this invention.

One example of a process of fabricating a multi-component product according to this invention is shown in FIG. 17. A superconductor powder 30 (in this embodiment $Bi_{16.1}Pb_{0.4}Sr_2Ca_2Cu_3O_{10}$) which was produced by conventional solidus reaction method is filled into a silver pipe 31 10 mm in outer diameter, 7 mm in inner diameter and 500 mm in length. This is drawn by a draw bench into a wire 5 mm in outer diameter and is further worked into a thin tape wire 32 0.15 mm thick by a rolling mill. After this tape wire 32 is heat-treated at 845° C. for 100 hours, it is coiled in the direction of its transverse cross-section i.e. around a longitudinal axis. The coiled tape 33 is further worked into a wire 34 of hexagonal cross-section by a hexagon die. The wire 34 measures 2.8 mm along a diagonal line of the hexagonal cross-section and is 1–2 m in length. This core wire 34 is inserted into holes 36 in a silver rod 35 that are formed to the same shape and dimension as the core wire. The rod loaded with core wires is drawn again into a wire 2 mm in outer diameter, which is then heat-treated at 845° C. for 100 hours. When the product is to be formed into a coil, it is coiled before being subjected to this final heat treatment. The thickness of the superconductor cores in the final wire product is 0.1 μm to 0.2 mm depending on the degree to which the wire is drawn.

Figure 18:
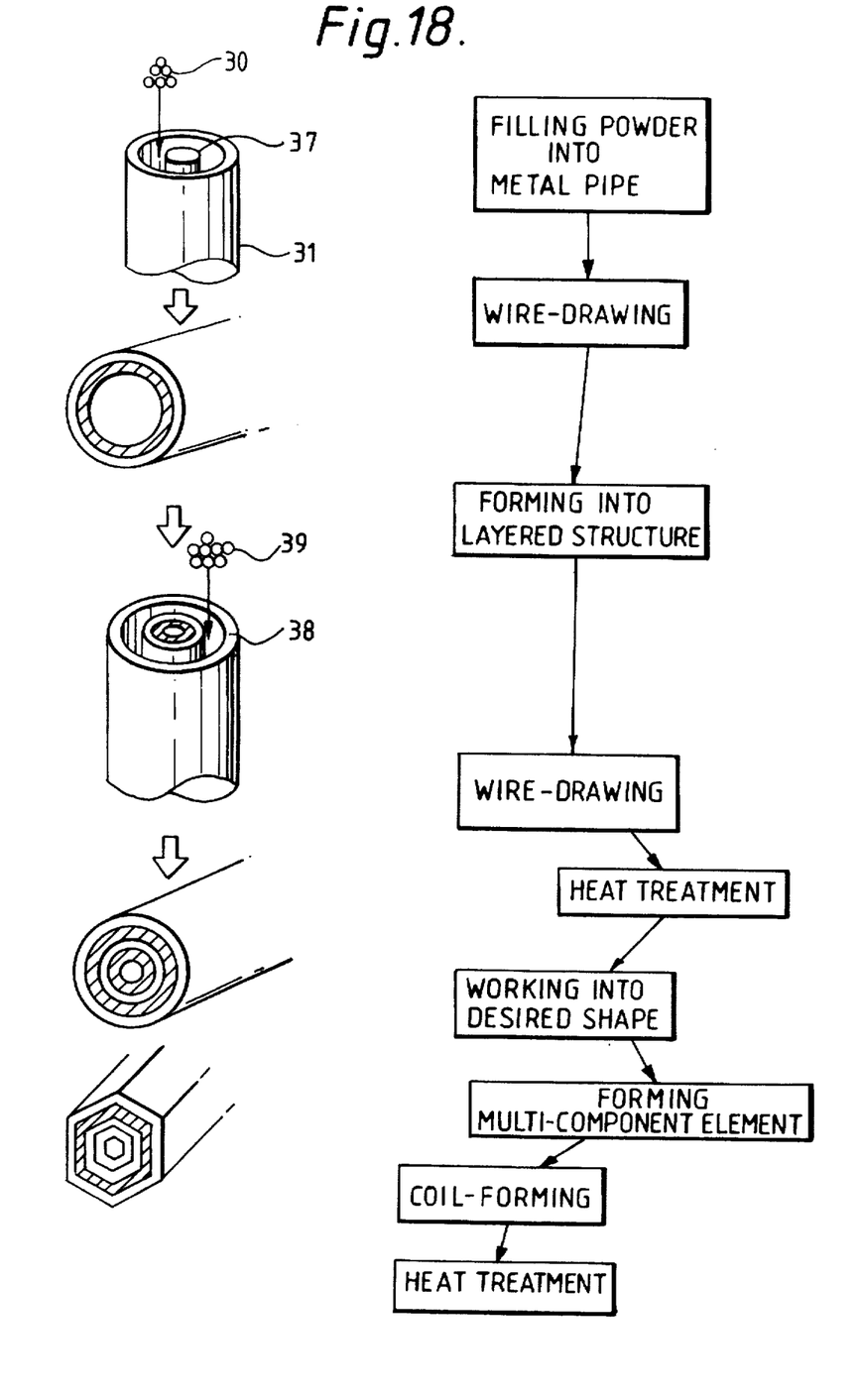

Next, a process of fabricating an element with the layered structure according to this invention as shown in FIGS. 11, 12 and 15 will be explained by FIG. 18. A superconductor powder 30 (in this embodiment $Tl_2Ba_2Ca_2Cu_3O_{10}$) which was produced by a conventional solidus reaction method is filled into a silver pipe 31 10 mm in outer diameter, 8 mm in inner diameter and 400 mm in length. At this time, a silver rod 37 5 mm across is inserted at the centre of the silver pipe 31. The superconductor powder is uniformly filled into the gap between the silver bar and the silver pipe. This composite rod is drawn by a draw bench into a wire 5 mm across. The drawn wire is inserted into another silver pipe 38 10 mm in outer diameter, 8 mm in inner diameter and 400 mm in length. Superconductive powder 39 is loaded into the gap between the pipe 38 and the wire. This process is repeated to form a multilayered element.

Using a hexagon die, the element is worked into a hexagonal cross-section of side length 1.4 mm. Forming a multiple element with multiple components as well as coiling may be done in the same way as described in FIG. 17.

The thickness of the superconductive core layers in the final product is 0.1 μm to 0.1 mm. It was found that the crystal orientation becomes better as the core thickness gets smaller. The final heat treatment was performed at 845° C. for 100 hours.

Figure 19:
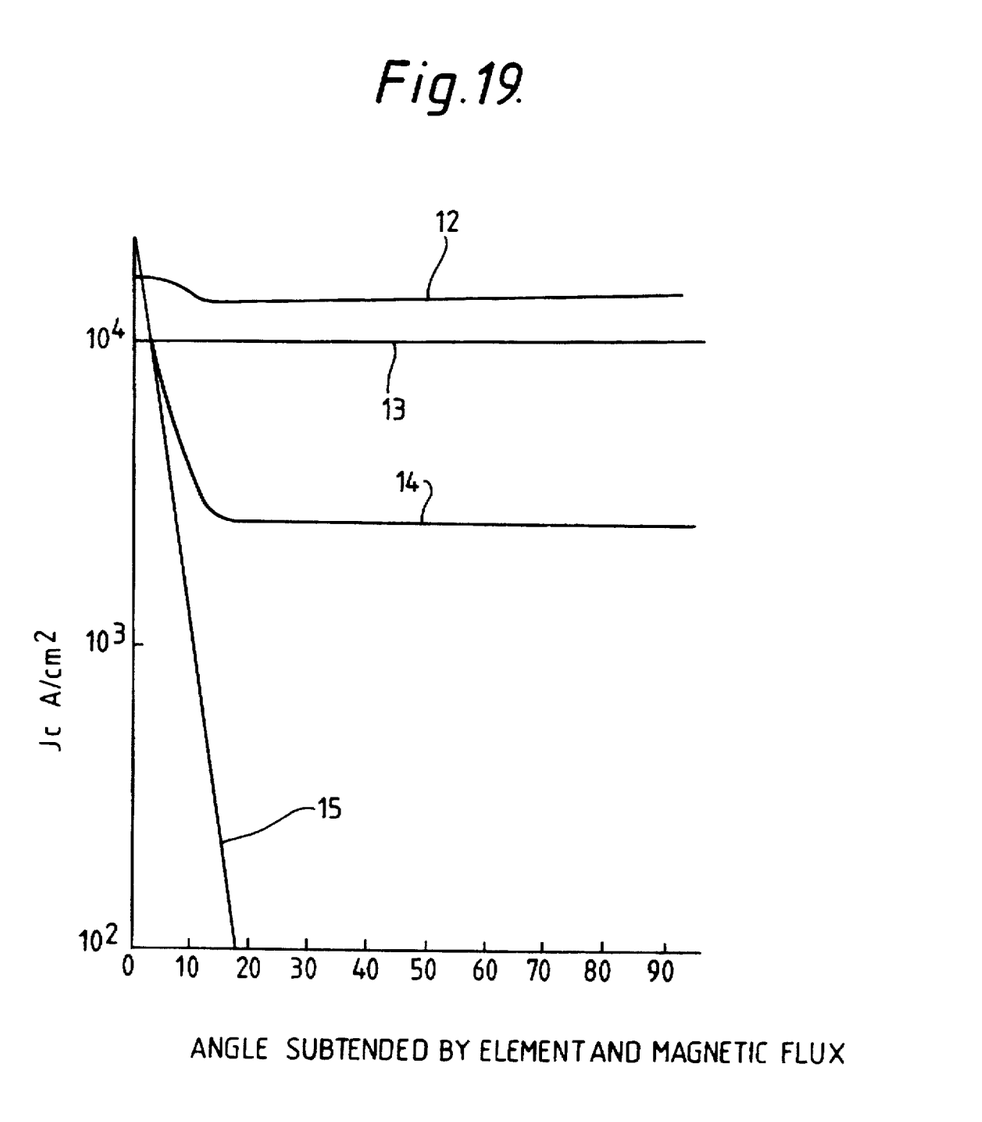
FIG. 19 is a graph showing the relationship between the critical current density Jc and the angle subtended by the magnetic field and some superconductive elements of this invention and a previously proposed wire product.

FIG. 19 shows the relationship between the angle subtended by the crystal a-b plane in a wire product and the magnetic field and the critical current density Jc, for several products of this invention and a previously known product. The critical current density was measured by the dc 4-terminal resistance method, which uses a current value when 1 μV is generated between voltage terminals and calculated from cross-sectional area of the oxide superconductor element.

This measurement was taken in liquid nitrogen (77K) at the external magnetic field of 1 T. The directions of current and magnetic flux were perpendicular to each other.

The lines in FIG. 19 relate to products as follows:

12 ... product of the invention (FIG. 15)
13 ... product of the invention (FIG. 10)
14 ... product of the invention (FIG. 5)
15 ... known product for comparison having a cross-sectional structure as shown in FIG. 10, but in the plane perpendicular to the longitudinal direction, the oxide crystals are oriented in one direction only.

From FIG. 19, it is seen that the products of this invention have relatively small or very small dependency of Jc on the direction of magnetic field. On the other hand, the known product cannot pass a superconducting current when the angle between the a-b crystal plane and the magnetic flux approaches 20°. With the product of this invention, however, the critical current density is as high as $10^3$ A/cm$^2$ or more. Particularly with the elements of this invention corresponding to lines 12, 13 of FIG. 19, in which the crystals are oriented isotropically, the fall in the critical current density due to variation of the angle is small. The element of line 13 in which crystal alignment directions of the core wires are oriented completely at random shows no change in the critical current density.

The present invention is concerned with the element structure and does not place particular limitations on the superconducting oxide material used. In the following, we list materials which have been found by experiment to have similar effects as those of the preceding embodiments.

Table b llists some of the currently known major superconductive oxides. The present inventors, using these materials, made elements of hexagonal cross-section by the fabrication procedure shown in FIG. 18.

These elements were heat-treated under the known optimum conditions. As a result, the elements of hexagonal cross-section exhibited almost the same critical temperatures Tc as the corresponding bulk materials. These results are shown in the following Table, together with results of tests of critical current density of the elements at temperatures of 4.2K and 77K, as indicated. The critical current density at these temperatures with no magnetic field applied is Jco. The critical current density Jc was measured with a magnetic field of 1 T applied and at two mutually perpendicular orientations of the element in the magnetic field (θ=0° and θ=90°). The directions of magnetic field and current were perpendicular to each other. The results indicate that the fall in the critical current density Jc in the magnetic field relative to the value at no field is constant at about one third of the Jco value.

TABLE

| No. | Composition | Critical temperature of bulk (K) | Critical temperature of wire (K) | Jc/Jco θ = 0° | Jc/Jco θ = 90° | Measurement temperature (K) |
|---|---|---|---|---|---|---|
| Lanthanum Oxide | | | | | | |
| 1 | $La_{1.8}Ba_{0.2}Cu_1O_4$ | 30 | 28 | 0.31 | 0.36 | 4.2 |
| 2 | $La_{1.8}Sr_{0.2}Cu_1O_4$ | 40 | 35 | 0.32 | 0.28 | 4.2 |
| 3 | $La_{1.8}Ca_{0.2}Cu_1O_4$ | 30 | 27 | 0.28 | 0.33 | 4.2 |
| 4 | $La_{1.8}Na_{0.2}Cu_1O_4$ | 40 | 39 | 0.33 | 0.35 | 4.2 |
| 5 | $La_{2.0}Cu_1O_4$ | 40 | 38 | 0.30 | 0.37 | 4.2 |
| Yttrium Oxide | | | | | | |
| 6 | $Y_1Ba_2Cu_3O_7$ | 94 | 94 | 0.31 | 0.39 | 4.2 |
| 7 | $Y_1Sr_2Cu_3O_7$ | 80 | 79 | 0.35 | 0.33 | 4.2 |
| 8 | $La_1Ba_2Cu_3O_7$ | 90 | 88 | 0.30 | 0.25 | 4.2 |
| 9 | $Ca_1Ba_1La_1Cu_3O_7$ | 80 | 78 | 0.29 | 0.38 | 4.2 |
| 10 | $Y_2Ba_4Cu_8O_{16}$ | 80 | 78 | 0.25 | 0.35 | 4.2 |
| Bismuth Oxide | | | | | | |
| 11 | $Bi_2Sr_2Cu_1O_6$ | 7 | 10 | 0.31 | 0.33 | 4.2 |
| 12 | $Bi_2Sr_2Ca_1Cu_2O_8$ | 80 | 80 | 0.33 | 0.32 | 77 |
| 13 | $Bi_2Sr_2Ca_2Cu_3O_{10}$ | 110 | 110 | 0.30 | 0.35 | 77 |
| Thalium Oxide | | | | | | |
| 14 | $Tl_2Ba_2Cu_1O_6$ | 90 | 90 | 0.30 | 0.33 | 77 |
| 15 | $Tl_2Ba_2Ca_1Cu_2O_8$ | 105 | 105 | 0.29 | 0.36 | 77 |
| 16 | $Tl_2Ba_2Ca_2Cu_3O_{10}$ | 122 | 122 | 0.38 | 0.37 | 77 |
| 17 | $Tl_2Ba_2Ca_3Cu_4O_{12}$ | 117 | 117 | 0.40 | 0.32 | 77 |
| 18 | $Tl_1Ba_2Cu_1O_5$ | 20 | 18 | 0.32 | 0.35 | 4.2 |
| 19 | $Tl_1Ba_2Ca_1Cu_2O_7$ | 91 | 91 | 0.35 | 0.39 | 77 |
| 20 | $Tl_1Ba_2Ca_1Cu_3O_9$ | 116 | 116 | 0.29 | 0.27 | 77 |
| 21 | $Tl_1Ba_2Ca_3Cu_4O_{11}$ | 122 | 122 | 0.33 | 0.29 | 77 |
| 22 | $Tl_1Ba_2Ca_4Cu_5O_{13}$ | 117 | 117 | 0.32 | 0.38 | 77 |
| 23 | $Tl_1Sr_2Ca_1Cu_2O_7$ | 75 | 75 | 0.35 | 0.37 | 4.2 |
| 24 | $Tl_1Sr_2Ca_2Cu_3O_9$ | 100 | 100 | 0.32 | 0.35 | 77 |
| 25 | $Tl_{0.8}Pb_{0.2}Sr_2Ca_1Cu_2O_7$ | 90 | 88 | 0.38 | 0.33 | 77 |
| 26 | $Tl_{0.8}Pb_{0.2}Sr_2Ca_2Cu_3O_9$ | 120 | 117 | 0.32 | 0.39 | 77 |

Figure 20:
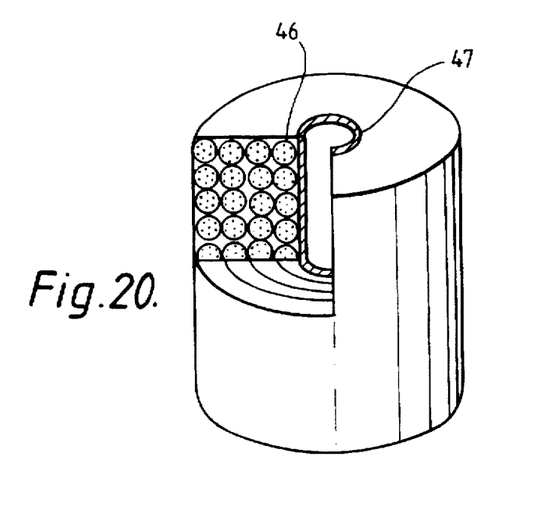
FIG. 20 is a partly cutaway perspective view of a solenoid coil using a superconductor element of this invention.

FIG. 20 is a partly cutaway view of a solenoid coil using a multi-component element 46, which consists of seven elements as shown in FIG. 12. A core cylinder 47 of the coil is an alumina cylinder. During the coiling operation, it is important to take care so that the directional relationship between the element a-b plane crystal orientation and the core cylinder does not change. The direction of the crystal orientation in each element may be marked at many parts on the element surface, if necessary.

Figure 21:
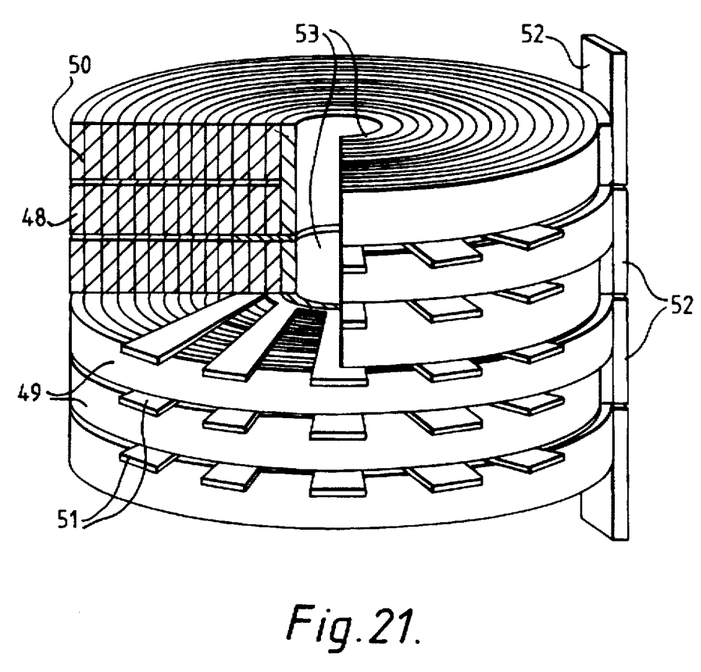
FIG. 21 is a partly cutaway perspective view showing the structure of a pancake coil using superconductor elements of this invention.

FIG. 21 shows one example of a double pancake coil using a multicore element 48 as shown in FIG. 5. The coil has six layers of windings 49 of the elements 48 in which the long faces of the elements 48 are parallel to the coil axis. The turns in each winding 49 are separated by insulation 50 in the form of non-woven alumina fabric. The windings 49 are separated by alumina spacer plates 51 and are connected in series by outside electrodes 52 of silver and coil cores 53 also of silver.

the coil of FIG. 20 generated a magnetic field of 0.1 T at 77K, while the coil of FIG. 21 produced a magnetic field of 1 T at 77K. The magnetic field intensity generated by coil depends on the number of turns of the windings, density of the windings, and current. When these parameters are optimized, it is possible to produce a stronger field.

With this invention it is thus possible to provide superconductive elements and coils thereof which have critical current densities at a liquid nitrogen temperature, let alone at a liquid helium temperature, and which have little dependence on the direction of the magnetic flux in strong magnetic fields.

What is claimed is:

1. An elongate superconductor wire, comprising a metal matrix cladding selected from the group consisting of silver, silver alloy, gold and gold alloy, said metal matrix cladding containing a plurality of flat oxide superconductor bodies, each of said flat oxide superconductor bodies having a planar direction, oxide superconductor crystals having c-axes, and an average c-axis direction normal to the planar direction of the flat oxide superconductor body, the planar direction of the flat oxide superconductor bodies being oriented in a radial direction of the wire, and wherein at least 50% of said oxide superconductor crystals having c-axes have their c-axes oriented within 30 degrees of the average c-axis direction.

2. The elongate superconductor wire according to claim 1, wherein said oxide superconductor crystals are selected from the group consisting of:

where x1 and y1 are 0–0.5, a1, b1 and c1 are 1.8–2.2, d1 is 1.7–3.3, e1 is 8–10 and a1+b1+c1+d1 is 9 or less;

where x2 is 0–0.5, a2, b2 and c2 are 1.8–2.2, d2 is 1.7–3.3, e2 is 8–10 and a2+b2+c2+d2 is 9 or less; and where Y is one or more elements chosen from yttrium and the lanthanide series, a3 is 0.9–1.1, b3 is 1.8–2.2, c3 is 2.7–4.4, a3+b3+c3 is 7 or less, δ is 0–0.5, and d3 is 8 or less.

3. The elongate superconductor wire according to claim 1, wherein the c-axes of at least 80% of all of said oxide superconductor crystals of said flat oxide superconductor bodies are at an angle in the range of 60° to 90° to a longitudinal axis of the wire.

4. The elongate superconductor wire according to claim 1, wherein the c-axes of at least 80% of all of said oxide superconductor crystals of said flat oxide superconductor bodies are at an angle in the range of 80° to 90° to a longitudinal axis of the wire.

5. The elongate superconductor wire according to claim 1, wherein, for each of said flat oxide superconductor bodies, the c-axes of at least 80% of said oxide superconductor crystals therein are within 30° of the average c-axis alignment direction of that flat oxide superconductor body.

6. The elongate superconductor wire according to claim 1, wherein, for each of said flat oxide superconductor bodies, the c-axes of at least 80% of said oxide superconductor crystals therein are within 10° of the average c-axis alignment direction of that flat oxide superconductor body.

7. The elongate superconductor wire according to claim 1, wherein every direction perpendicular to a longitudinal axis of the wire is at an angle of no more than 30° to the average c-axis alignment direction of at least one of said flat oxide superconductor bodies.

8. The elongate superconductor wire according to claim 1, wherein the average c-axis alignment direction of at least one of said flat oxide superconductor bodies is at an angle of at least 45° to the average c-axis alignment direction of at least one other of said flat oxide superconductor bodies.

9. The elongate superconductor wire according to claim 1, wherein the average c-axis alignment direction of at least one of said flat oxide superconductor bodies is at an angle of about 90° to the average c-axis alignment direction of at least one other of said flat oxide superconductor bodies.

10. A coil comprising windings of the elongate superconductor wire according to claim 1.

* * * * *